Dec. 8, 1964 B. CHRISTENSEN 3,160,835

MONOLITHIC SEMICONDUCTOR CIRCUIT WITH ENERGY STORAGE JUNCTION AND FEEDBACK TO ACTIVE TRANSISTOR TO PRODUCE TWO TERMINAL INDUCTANCE

Filed Nov. 21, 1960 2 Sheets-Sheet 1

INVENTOR.
Bent Christensen
BY
Frederick Shapoe
ATTORNEY

Dec. 8, 1964 B. CHRISTENSEN 3,160,835

MONOLITHIC SEMICONDUCTOR CIRCUIT WITH ENERGY STORAGE JUNCTION AND FEEDBACK TO ACTIVE TRANSISTOR TO PRODUCE TWO TERMINAL INDUCTANCE

Filed Nov. 21, 1960 2 Sheets-Sheet 2

INVENTOR.
Bent Christensen

BY Frederick Shapoe

ATTORNEY

1

3,160,835

MONOLITHIC SEMICONDUCTOR CIRCUIT WITH ENERGY STORAGE JUNCTION AND FEEDBACK TO ACTIVE TRANSISTOR TO PRODUCE TWO TERMINAL INDUCTANCE

Bent Christensen, Mountain View, Calif., assignor to Westinghouse Electric Corporation, East Pittsburgh, Pa., a corporation of Pennsylvania Filed Nov. 21, 1960, Ser. No. 70,630
6 Claims. (Cl. 333—80)

The present invention relates generally to monolithic semiconductor devices and is more particularly concerned with a two-terminal circuit made up of an active circuit element and an RC network connected to simulate an inductor or linear reactor.

The development of monolithic semiconductor devices wherein the conventional parameters of an electronic circuit are formed within a unitary body of semiconductor material has been impeded, prior to the present invention, by the problem of providing a portion of the device which behaves like an inductor. Thus, it is possible in such devices to develop by known techniques a body of semiconductor material made up of a plurality of alternate P type and N type conductivity layers and including active regions functioning as transistors or other semiconductor junction elements, energy storage regions each formed by a reverse biased junction acting as a capacitance, and dissipative regions acting as resistances. However, the problem of providing a region or a combination of these known regions to act as an inductance has heretofore defied solution. Since many of the most common electronic circuits require one or more inductance elements, it would, of course, be highly desirable to provide means for simulating an inductor in monolithic semiconductor devices and, as a consequence, the satisfaction of this desire constitutes one of the primary objects of the present invention.

Another object of the invention is to provide a circuit which behaves like an inductance but is insensitive to external magnetic fields.

A further object of the invention is to provide a circuit made up exclusively of known regions of a monolithic semiconductor device so connected that the circuit acts as an inductor.

The invention has for another object the provision of a new and improved circuit which employs an active element having one or more capacitors in its output with the active element being effective to transform the capacitive reactance of the output to an inductive admittance at the circuit input, whereby the circuit acts like an inductance.

Another object of the present invention is to provide a circuit made up of one or more p-n junction regions, energy storage regions, and regions forming resistances or other impedances, all of the regions being formed within a unitary or monolithic body of semiconductor material and being electrically connected in such a manner that the circuit behaves as an inductance.

The invention has for a further object the provision of a monolithic semiconductor device comprising within a unitary body of semiconductor material, at least one active region, at least one energy storage region formed by a reverse biased junction, and one or more dissipative

2 regions, all of said regions being formed in the body of the semiconductor material and cooperating to form a circuit which appears inductive across its terminals.

The invention has for another object the provision of a single, unitary, semiconductor member having a plurality of interrelated doped regions forming p-n junctions, the different regions being electrically connected through the bulk of the semiconductor member to form a circuit which behaves like an inductance.

The foregoing and other objects are realized, in accordance with the present invention, by providing a new and improved two-terminal circuit having an inductive input admittance. The circuit is made up of a multiple layer junction device serving as an active element for transforming the capacitive reactance of an RC network in its output into an inductive admittance across the circuit input terminals. A feedback network is connected between the output and the circuit input. Preferably the active element, the output network and the feedback network are all formed in a unitary or monolithic semiconductor device with the capacitance or capacitances each comprising an energy storage region formed by a reverse biased semiconductor junction, and the resistors comprising dissipative regions formed in the semiconductor material of said device.

The invention, both as to its organization and manner of operation, together with further objects and advantages thereof, will best be understood by reference to the following detailed description taken in conjunction with the accompanying drawings wherein.

As was indicated above, the present invention provides a solution to the problem of providing an inductive admittance or impedance while using only capacitors and resistors as passive circuit elements. In accordance with the invention, the problem is solved by employing an active RC network of very simple circuit construction. Such a network provides an inductive admittance at its input terminals and is, at the same time, insensitive to external magnetic fields. The active RC network is formed as a monolithic semiconductor device or as a region of such a device. The invention also deals with specific circuit arrangements providing inductive driving point admittances with relatively high Q or quality factor.

Figure 1:
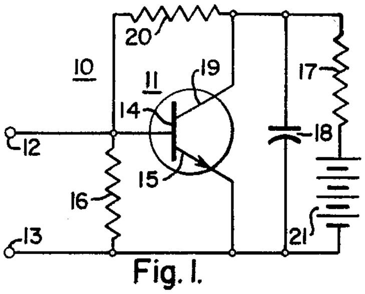
FIG. 1 is a schematic diagram illustrating a circuit characterized by the features of the present invention.

Turning now to the drawings and considering first FIG. 1, a two-terminal RC network is there illustrated schematically in a circuit arrangement characterized by the features of the present invention and indicated generally by the reference numeral 10. The network includes an active element which is illustrated as a transistor 11 of the n-p-n conductivity type connected in a feedback amplifier circuit. The active element, may, of course, comprise a transistor of the p-n-p conductivity type or, as a matter of fact, it may be formed by other multiple element semiconductor devices.

In the form shown in FIG. 1, the input terminals 12 and 13 of the network 10 are respectively connected to the base 14 and the emitter 15 of the transistor 11 and to the opposite ends of an input resistor 16. An RC network formed by a resistor 17 and a capacitor 18 is connected in the output of the active element and, specifically, to the collector 19 of the transistor. Feedback from the output circuit to the input circuit is effected through a resistor 20 connected between the collector 19 and the base 14. D.C. operating potentials for the transistor are supplied from any suitable D.C. source represented by a battery 21.

It can be demonstrated both mathematically and by actual measurement that the parameters of the network 10 may be so selected that the input admittance looking into terminals 12 and 13 contains an inductive component and a resistive component at a particular frequency. The parameters may, of course, be selected to provide the necessary admittance to simulate an inductance of desired value. However, the selection of components will also be governed to some extent by the desired Q or quality factor of the input admittance. In one circuit arrangement which was constructed upon a conventional breadboard in order to demonstrate the feasibility of obtaining an inductive input admittance in accordance with the principles of the present invention the following parameters were selected:

| | |
|---|---|
| Transistor 11 | Type 2N338. |
| Resistor 16 | Very, very large, i.e., an open circuit. |
| Resistor 17 | 20,000 ohms. |
| Resistor 20 | 10,000 ohms. |
| Capacitor 18 | 2000 micromicrofarads. |

Figure 2:
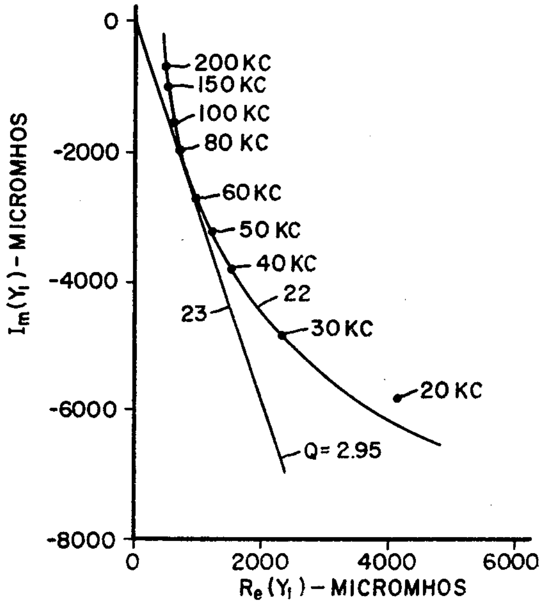
FIG. 2 is a plot of the driving point admittance of the circuit shown in FIG. 1.

FIG. 2 illustrates a curve 22 resulting from a plot of the driving point admittance of the circuit shown in FIG. 1 at various frequencies ranging from 20 to 200 kilocycles per second. The curve 22 was obtained by plotting the imaginary component, $I_m(Y_1)$ of the driving point admittance as a function of the real component $R_e(Y_1)$ at the different frequencies. The slope of the straight line 23 is, of course, a function of the Q or quality factor, that is, the ratio of the input inductive reactance and the input resistance, at a frequency of 70 kilocycles per second. The circuit described was found to simulate an inductance of 0.95 millihenries having a Q of about 2.95 at 70 kilocycles per second. Thus, it will be observed that the Q of the circuit 10 is relatively low. When the current transfer function of the amplifier shown in FIG. 1 has one pole the Q may be increased by making the D.C. current gain of the transistor very high. However, the use of a large current gain transistor makes the circuit highly sensitive to changes in circuit parameters caused by temperature variations and to fluctuations in supply voltage and, as a result, this expedient does not afford an entirely satisfactory solution to the problem of increasing the Q.

Figure 8:
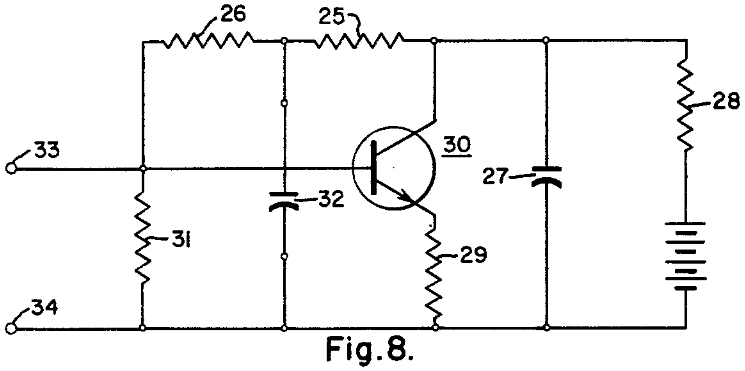
FIG. 8 is a schematic diagram illustrating a second embodiment of the present invention.

A second circuit providing a much higher Q is illustrated in FIG. 8. This circuit is similar to that shown in FIG. 1 but includes a pair of resistors 25 and 26 in the feedback network in place of the single resistor 20 previously described. The circuit shown in FIG. 8 again includes a very large input resistor 31 and an RC network formed by a capacitor 27 and a resistor 28 in the output of its transistor or active element 30. However, a resistor 29 is connected in the emitter circuit of the transistor and a second capacitor 32 is connected between the latter resistor and the junction between the feedback network resistors 25 and 26. To provide an input admittance across terminals 33 and 34 simulating an inductance of 12 millihenries and having a Q of 20 at a frequency of 50 kilocycles per second the following parameters were selected in constructing a breadboard circuit following the principles of the present invention:

| | |
|---|---|
| Transistor 30 | Type 2N338. |
| Resistors 25 and 26 | 16,000 ohms each. |
| Resistors 28 and 29 | 180 ohms each. |
| Resistor 31 | Very, very high, i.e., an open circuit. |
| Capacitor 27 | 540 micromicrofarads. |
| Capacitor 32 | 486 micromicrofarads. |

Figure 9:
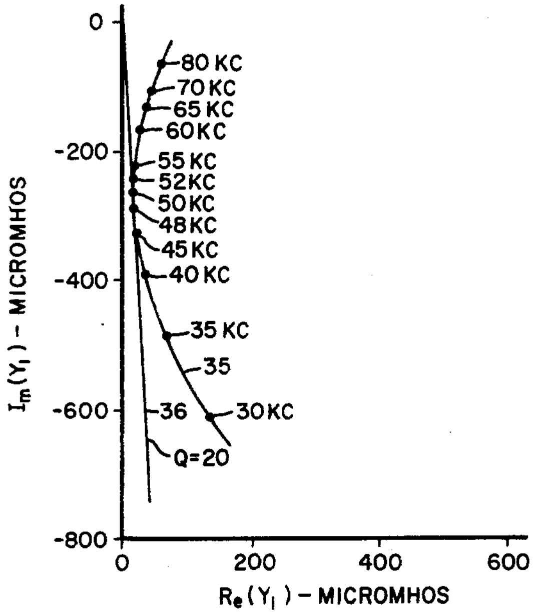
FIG. 9 is a plot of the driving point admittance of the circuit shown in FIG. 8.

FIG. 9 shows a curve 35 representing the driving point admittance of the circuit shown in FIG. 8 at different frequencies ranging from 30 to 80 kilocycles per second. The straight line 36 represents the Q of the circuit at a frequency of 50 kilocycles per second. The curve 35 and the line 36 were obtained in the same manner as those shown in FIG. 2, and, hence, they will not be described further.

The maximum value of Q that can be obtained from the circuit shown in FIG. 8 depends upon such factors as the frequency involved, the desired value of the inductance at that frequency, the temperature range, the transistor characteristics, the supply voltage variations, etc. Thus, the circuit parameters may be adjusted to obtain an optimum Q considering all of the listed factors. Moreover, other circuit arrangements may also be employed to simulate an inductance using the active RC network principle of the present invention.

The circuits shown, as was previously indicated, readily lend themselves to construction as a monolithic semiconductor device or as a region of such a device, thus economizing upon the space required and, at the same time, eliminating the necessity for soldered connections and the like in order to reduce the possibility of circuit failure during operation. The manner in which the circuit shown in FIG. 1 is formed as a unitary or monolithic semiconductor device is illustrated in FIGS. 3 to 7 of the drawings where a device is illustrated employing only known regions to provide the active and passive elements of the circuit.

For the purpose of clarity, the present invention will be described specifically in terms of preparing the active RC network shown in FIG. 1 in a semiconductor silicon body. It will be understood, however, that in addition to silicon, other semiconductor materials, for example, germanium or a semiconducting compound comprised, for example, of stoichiometric proportions of elements from Group III of the Periodic Table, for example, gallium, aluminum and indium, and elements from Group V, for example, arsenic, phosphorous and antimony. Examples of suitable Group III–V stoichiometric compounds include gallium arsenide, gallium antimonide, gallium phosphide, indium arsenide and indium antimonide. It will also be understood that the silicon or other semiconductor may be processed so that the semiconductivity of the various regions may be reversed in preparing the devices.

Figure 3:
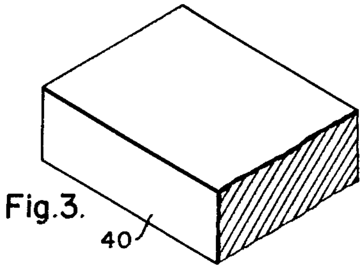
FIGS. 3 and 4 are perspective views showing portions of a semiconductor wafer being processed through different stages in accordance with the teachings of the present invention.

With reference to FIG. 3, there is illustrated a broken away portion of a single crystal silicon wafer 40 of n-type semiconductivity. The wafer 40 may be prepared by any of the methods known to those skilled in the art, for example, a single-crystal silicon rod may be pulled from a melt comprised of silicon and at least one element from Group V of the Periodic Table, for example, arsenic, antimony or phosphorous. The wafer 40 is then cut from the rod in any suitable manner, for example, by using a diamond saw. The cut surface of the wafer may then be lapped or etched or both to product a smooth surface after sawing. In addition, the semiconductor device of this invention may be prepared from a section of dendritic crystal prepared in accordance with U.S. patent application Serial No. 844,288, filed October 5, 1959, now Patent 3,031,403, the assignee of which is the same as that of the present invention.

The wafer 40 should preferably have a resistivity of from 10 ohm-cm. to 100 ohm-cm. and preferably about 50 ohm-cm. Since the bulk of the wafer makes up the dissipative or resistance regions of the finished device it is desirable that the wafer have a resistivity within this range. The area of the block is largely determined by the required capacitance of the reverse biased junctions which in turn, as was described above, depends on the desired input admittance of the active RC network.

The wafer 40 is disposed in a diffusion furnace. The hottest zone of the furnace is at a temperature within the range of 1100° C. to 1250° C. and has an atmosphere of the vapor of an acceptor doping material, for example, indium, gallium, aluminum, or boron. The zone of the furnace within which a crucible of said acceptor impurity lies may be at a temperature of from 600° C. to 1250° C., the specific temperature being chosen to ensure the desired vapor pressure and surface concentration of diffusant from the crucible. The acceptor impurity diffuses into the surface of the n-type wafer. Since the acceptor impurity will normally diffuse through all sides of the wafer it may be necessary to mask those sides or surfaces through which no diffusion is desired. Alternatively, the acceptor impurity may be allowed to diffuse through all of the surfaces of the wafer, and then the wafer may be abraded or etched, or both, in order to remove the diffused layer or layers from the undesired portions of the wafer.

Figures 4, 5, 6:
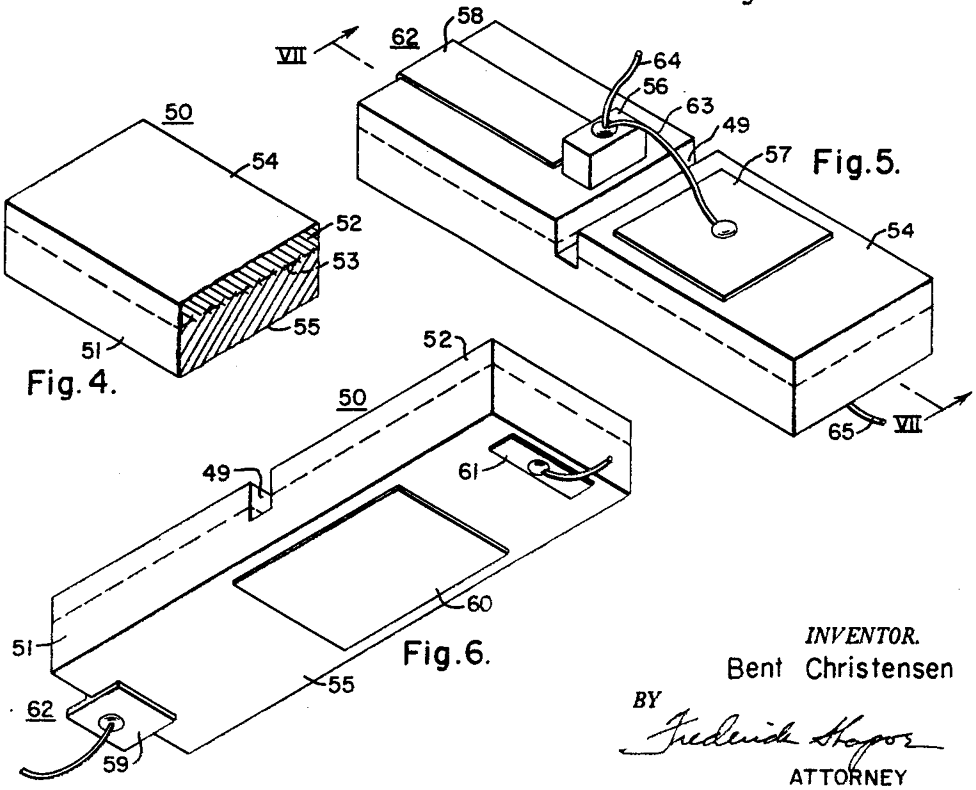
FIG. 5 is a top perspective view of a wafer of semiconductor material being further processed in accordance with the present invention.
FIG. 6 is a bottom perspective view of the wafer shown in FIG. 5.

With reference to FIG. 4, there is illustrated a wafer 50 which is the n-type wafer of FIG. 3 after diffusion of a doping impurity through only the top surface of the wafer, or where the diffused layer has been removed from all but the top portion of the wafer. The wafer 50 is comprised of an n-type region 51 and a p-type region 52 comprising the diffused impurity area. There is a p-n junction 53 formed between the regions 51 and 52 and intermediate the top surface 54 and the bottom surface 55 of the wafer.

The depth or thickness of the p-type region 52 is dependent primarily upon the desired design characteristics of the completed active RC network 10. In addition, it must be deep enough to permit the alloying or fusion of additional contacts to the top surface 54 without penetration entirely through the p-type region 52 to the n-type region 51. A depth of approximately 0.8 mil has been found to be satisfactory in a wafer having a total thickness of about 7 mils.

Referring next to FIG. 5, a groove 49 is formed in the wafer 50 after the diffusion has been completed. This groove extends transversely of the wafer from one side edge to the other and has a depth sufficient to penetrate from the top surface 54 entirely through the region 52 and slightly into the region 51. The groove 49 may be formed in any suitable manner as, for example, by sand blasting through a suitable mask but preferably it is formed by etching. To this end, the surfaces of the wafer 50 including the top surface 54 are coated with an acid resisting masking material, for example, apiezon wax. A portion of the masking material is removed along the area of the top surface 54 where the groove 49 is to be formed. This may be accomplished by use of a scribe. The coated wafer 50 with a portion exposed is then etched with a suitable silicon etchant, for example, an etchant comprised of, all parts by volume, 3 parts nitric acid, 1 part hydrofluoric acid and 1 part acetic acid. The etching is continued until the scribed area is etched entirely through the p-type region 52 to form the transverse groove 49. The etching is then terminated and the masking material is removed from the surfaces of the wafer.

Referring again to FIG. 5, it will be observed that an emitter portion 56 of n-type semiconductivity and ohmic contacts 57 and 58 which are comprised of a neutral metal, preferably gold, and a p-type doping material, are secured to the top surface 54 of the wafer 50 by disposing the respective materials upon the latter surface and by then alloying or fusing them to this surface by heating in a vacuum of at least $10^{-2}$ mm. Hg, and preferably higher for example $10^{-5}$ mm. Hg, at a temperature of from 400° C. to 700° C.

The emitter portion 56 may be formed from, for example,, a block comprised of a semiconductor such as silicon and at least one suitable n-type material, for example, antimony, arsenic and phosphorous, or, in the alternative, it might take the form of a foil comprised of an alloy of a neutral metal, for example, gold, and at least one n-type doping material. Examples of suitable emitter alloys include an alloy comprised of from 99.0% to 99.5% gold, and 1% to 0.5% antimony.

The ohmic contacts 57 and 58 may be formed from a foil comprised of a neutral metal, preferably gold and a p-type doping material, preferably boron. It will be noted that the foil 58 extends along a portion of the top surface 54 of the water 50 and is then bent downwardly to extend along one end of the wafer for a purpose which will be discussed hereinafter.

A suitable thickness of the foils employed to form the contacts 57 and 58 can be determined from a component phase diagram and the thickness of the regions 51 and 52. In this case, where the region 52 is approximately 0.8 mil thick, gold foil thickness of from 0.75 mil to approximately 1.5 mils, preferably about 1 mil, has been found to be satisfactory for alloying to the top surface of the wafer.

The temperature at which the foils are alloyed to the wafer depends to a degree upon the composition of the foils. If no aluminum is present the fusion or alloying can be carried out at a temperature as low as 400° C. However, if the foils 57 and 58 contain a relatively high percentage of aluminum a temperature of about 600° C. is required.

Referring next to FIG. 6, during the alloying and fusion of the emitter 56 and the ohmic contacts 57 and 58 to the top surface 54 of the wafer 50, ohmic contacts 59, 60 and 61 are fused to the bottom surface 55 of the wafer. The contact 59 is formed from a foil comprised of a neutral metal, preferably gold, and an n-type doping material alloyed therein. It will be noted that a portion of the foil extends over the edge of the surface 55 to meet the lower edge of the downwardly bent portion of the contact 58. During the fusion, the foil 58 alloys with region 52 and forms an ohmic contact therewith while the foil 59 alloys with region 51 to form an ohmic contact therewith. The portion of foil 58 extending along the end of the wafer and that portion of the foil 59 extending over the edge of bottom surface 55 flow together to form along the end of the wafer a continuous contact denoted as 62. The contact 62 might also be formed as a single piece embracing the end of the wafer but the handling of such a foil presents difficult problems. The use of an alloy of gold and a doping material to form each of the ohmic contacts ensures a good, low resistance contact between the wafer and each contact and, at the same time, permits the fusion to be carried out at a temperature well below the melting point of gold. It will be understood, of course, that the fusion and alloying step described immediately hereinabove can be carried out in a jig or other suitable apparatus to ensure that the various foils remain in position during the fusion and alloying.

It will also be recognized that the emitter could be formed integrally with the wafer instead of as a separate block or foil. This could be accomplished by starting with a p-type wafer and by diffusion of a donor doping material such as anitmony, arensic or phosphorous into both the top and bottom surfaces. The top surface may then be etched after masking the area to be used as the emitter with the etching being carried out for a period of time sufficient to remove all of the top layer except for the small emitter region. The transverse groove 49 and the ohmic contacts could then be formed in the manner previously described.

External leads or circuit connections may be secured to the emitter 56 and to the ohmic contacts 57, 58–59 and 61, for example, by soldering, thereby to complete the formation of a molecularized or monolithic active D.C. network like that shown schematically in FIG. 1. Specifically, a direct connection is made between the emitter 56 and the ohmic contact 57 via a connector 63 while conductors 64 and 65, which are respectively connected to the emitter 56 and to the ohmic contact 61, are connected to opposite sides of the D.C. source 21. If the monolithic semiconductor device is employed as a separate unit the input terminals 12 and 13 are respectively formed by a lead 66 connected to the ohmic contact 58–59 and by the conductor 64. As was indicated previously, however, the device illustrated may comprise merely a region or area or a larger, more complex monolithic semiconductor device in which case the input connections will be made within the body of the semiconductor material, thus avoiding the use of external leads.

Figure 7:
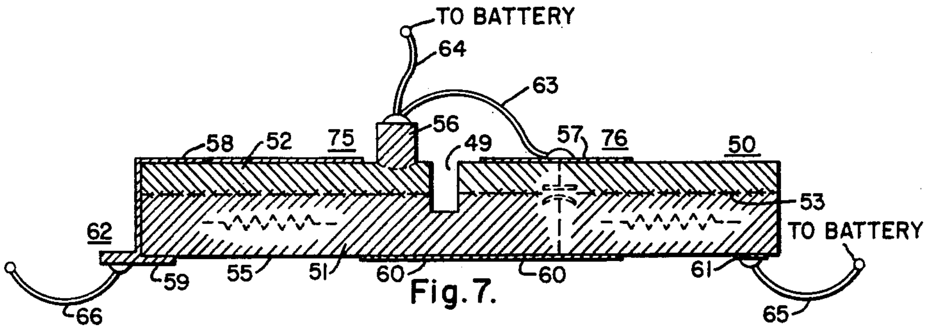
FIG. 7 is a sectional view taken along a line substantially corresponding to the line 7—7 in FIG. 5.

Referring to FIG. 7 in particular, the active RC network is formed by the transistor area 75 formed by the three layer structure of the emitter 56, and the regions 51 and 52. This transistor area operates as an active, unstable, regenerative region of the monolithic semiconductor device and serves as the active element 11 of the circuit shown in FIG. 1. The transistor area 75 is isolated by the groove 49 from a p-n junction area 76 at the other end of the wafer 50. The ohmic contacts 57 and 60 form contacts for reverse biasing the p-n junction in the area 76 to form an energy storage region to simulate the action of the capacitor 18 of the circuit shown in FIG. 1. The bulk of the semiconductor material forms dissipative regions simulating the resistors of the circuit shown in FIG. 1. Thus, the resistivity of the region 51 in the transistor area 75 serves to provide the resistance 20. The resistor 16 is an open circuit, and, hence, is represented by the break between the emitter 56 and the ohmic contact 58. The resistivity of region 51 in p-n junction area 76 forms the resistance 17.

While particular embodiments of the invention have been illustrated and described, it will be understood by those skilled in this art that many modifications and changes may be made without departing from the true spirit and scope of the invention as set forth in the appended claims.

What is claimed as new and desired to be secured by Letters Patent of the United States is:

1. A monolithic semiconductor device comprising a body of semiconductor material made up of a plurality of layers of alternating conductivity types, a first region of said device comprising at least three adjacent layers cooperating to form an active region, an energy storage region in said material comprising at least two adjacent layers cooperating to form a p-n junction, one of the layers of the energy storage region and a first of the layers of the active region being connected together through the body of semiconductor material, a first energy dissipative region in the body of said semiconductor material effectively connected to said first layer, whereby said first energy dissipative region cooperates with said energy storage region to form a resistance capacitance output network for said active region, means including a second energy dissipative region in the body of the semiconductor material connecting said first layer to a second layer of the active region, thereby forming a feedback circuit for said active region, and means so connecting said active region, said feedback circuit and said output network that an active resistance-capacitance network is formed having an inductive input admittance between said second layer and a third layer of said active region.

2. A monolithic semiconductor device comprising a body of semiconductor material made up of a plurality of layers of alternating conductivity types, a first region of said device comprising at least three adjacent layers cooperating to form an active region, an energy storage region in said material comprising at least two adjacent layers cooperating to form a p-n junction, means including a first energy dissipative region in the body of said semiconductor material cooperating with said energy storage region to form a resistance capacitance output network for said active region, means including a second energy dissipative region in the body of the semiconductor material forming a feedback circuit for said active region, and means so connecting said active region, said feedback circuit and said output network that an active resistance-capacitance network is formed having an inductive input admittance between two of the layers of said active region.

3. A monolithic semiconductor device comprising a body of semiconductor material made up of a plurality of layers of alternating conductivity types, a first region of said device comprising at least three adjacent layers cooperating to form an active region, an energy storage region in said material comprising at least two adjacent layers cooperating to form a p-n junction, means including a first energy dissipative region in the body of said semiconductor material cooperating with said energy storage region to form a resistance capacitance output network for said active region, and means connecting said active region, and said output network to form an active resistance-capacitance network having an inductive input admittance between said two of the layers of said active region.

4. A monolithic semiconductor device comprising a body of semiconductor material made up of a plurality of layers of alternating conductivity types, a first region of said device comprising at least three adjacent portions of different conductivity types cooperating to form an active region, an energy storage region in said material comprising at least two adjacent portions of different conductivity types cooperating to form a p-n junction, at least one energy dissipative region in the body of said semi-conductor material cooperating with said energy storage region to form a resistance capacitance output network for said active region, and means so connecting said active region, said energy storage region and said energy dissipative region that an active resistance-capacitance network is formed having an inductive input admittance.

5. A semiconductor device structure comprising, within a unitary body of semiconductive material: first, second and third semiconductive regions of alternate semiconductivity type with a first p-n junction between said first and second regions and a second p-n junction, of larger area than said first p-n junction, between said second and third regions, said first, second and third regions being capable of performing transistor functions; fourth and fifth semiconductive regions of opposite semiconductivity type with a third p-n junction therebetween, said fourth and fifth regions having the same semiconductivity types as said second and third regions, respectively, said fourth and fifth regions being capable of performing capacitor functions; sixth and seventh semiconductive regions each being capable of performing resistor functions; first means to interconnect said first region and said fourth region; second means to interconnect said second region and an extremity of said sixth region; third means to interconnect said third region, the other extremity of said sixth region, said fifth region and an extremity of said seventh region whereby an inductive input admittance appears across said first and second regions upon application of a suitable potential to the other extremity of said seventh region.

6. A semiconductor device structure in accordance with claim 5 wherein: said third, fifth, sixth and seventh regions are portions of a single continuous layer of semiconductive material having a resistivity of from 10 ohm-cm. to 100 ohm-cm. and first, second and third lead means are, respectively, in contact with each of said first and second regions and said other extremity of said seventh region.

References Cited in the file of this patent

UNITED STATES PATENTS

| | | |
|---|---|---|
| 2,762,873 | Goodrich | Sept. 11, 1956 |
| 2,846,592 | Rutz | Aug. 5, 1958 |
| 2,859,360 | Suran | Nov. 4, 1958 |
| 2,930,996 | Chow | Mar. 26, 1960 |
| 2,936,384 | White | May 10, 1960 |
| 2,936,431 | Guenther | May 10, 1960 |
| 2,976,426 | Rappapart | Mar. 21, 1961 |
| 2,991,371 | Lehovec | July 4, 1961 |